(12) United States Patent
Chen

(10) Patent No.: US 10,678,128 B2
(45) Date of Patent: Jun. 9, 2020

(54) PHOTO-MASK AND METHOD FOR MANUFACTURING ACTIVE SWITCH ARRAY SUBSTRATE THEREOF

(71) Applicants: HKC Corporation Limited, Shenzhen, Guangdong (CN); Chongqing HKC Optoelectronics Technology Corporation, Ltd., Chongqing (CN)

(72) Inventor: Yu-Jen Chen, Chongqing (CN)

(73) Assignees: HKC CORPORATION LIMITED, Shenzhen, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 372 days.

(21) Appl. No.: 15/550,698

(22) PCT Filed: May 17, 2017

(86) PCT No.: PCT/CN2017/084669
§ 371 (c)(1),
(2) Date: Aug. 11, 2017

(87) PCT Pub. No.: WO2018/176603
PCT Pub. Date: Oct. 4, 2018

(65) Prior Publication Data
US 2019/0384162 A1  Dec. 19, 2019

(30) Foreign Application Priority Data
Mar. 30, 2017  (CN) .......................... 2017 1 0203370

(51) Int. Cl.
*G03F 1/00* (2012.01)
*G02F 1/1339* (2006.01)
(Continued)

(52) U.S. Cl.
CPC .............. *G03F 1/52* (2013.01); *G02F 1/1368* (2013.01); *G02F 1/13439* (2013.01); *G02F 1/136209* (2013.01); *G02F 2001/136222* (2013.01)

(58) Field of Classification Search
None
See application file for complete search history.

(56) References Cited

U.S. PATENT DOCUMENTS

2006/0019174 A1*  1/2006  Ahn .................... G03F 7/70433
                                                          430/5
2007/0141481 A1*  6/2007  Kwack ..................... G03F 1/50
                                                          430/5
(Continued)

FOREIGN PATENT DOCUMENTS

| CN | 101344720 A | 1/2009 |
| CN | 104409416 A | 3/2015 |
| CN | 106526953 A | 3/2017 |

OTHER PUBLICATIONS

International Search Report dated Oct. 1, 2018, in the corresponding PCT application PCT/CN2017/084669, 12 pages in Chinese.

*Primary Examiner* — Herve-Louis Y Assouman
(74) *Attorney, Agent, or Firm* — Juan Carlos A. Marquez; Marquez IP Law Office, PLLC

(57) ABSTRACT

This application relates to a photo-mask and a method for manufacturing an active switch array substrate of the photo-mask. The photo-mask includes a transparent region, a light shielding region, and a semi-transparent region disposed between the transparent region and the light shielding region. A transmittance of the photo-mask is adjusted according to a doping amount and a distribution density of a low reflective material, so as to enable a transmittance of (Continued)

the semi-transparent region to be less than a transmittance of the transparent region and to be greater than a transmittance of the light shielding region.

14 Claims, 5 Drawing Sheets

(51) Int. Cl.
    *G02F 1/1335*      (2006.01)
    *G03F 1/52*      (2012.01)
    *G02F 1/1343*      (2006.01)
    *G02F 1/1362*      (2006.01)
    *G02F 1/1368*      (2006.01)

(56) References Cited

U.S. PATENT DOCUMENTS

2009/0220867 A1*   9/2009   Fujikawa .................. G03F 1/46
                                                                             430/5
2016/0077425 A1*   3/2016   Fukaya ..................... G03F 1/54
                                                                             430/5

\* cited by examiner

PHOTO-MASK AND METHOD FOR MANUFACTURING ACTIVE SWITCH ARRAY SUBSTRATE THEREOF

BACKGROUND

Technical Field

This application relates to a photo-mask used for an active switch array substrate, and in particular, to a photo-mask and a method for manufacturing an active switch array substrate thereof.

Related Art

With the development of science and technologies, liquid crystal displays (LCDs) become widespread for several advantages. For example, LCDs are energy saving and free of radiation and have small volumes, low power consumption, flat surfaces, right angles, high resolution, and stable picture quality. Especially, a variety of information products such as mobile phones, notebook computers, digital cameras, PDAs, and liquid crystal screens become increasingly widespread nowadays. As a result, the demands for LCDs are greatly increased. Therefore, how to meet pixel designs with increasing requirements for high resolution, an active switch array LCD (active switch array liquid crystal display) with desirable characteristics such as high picture quality, high space utilization, low power consumption, and being free of radiation gradually becomes the mainstream in the market. An active switch array substrate is an important component of an LCD.

An LCD is formed of a color filter (CF) substrate, an active switch array substrate, and liquid crystals filled between the two substrates. In an LCD with a relatively large size, to keep a gap between two substrates, a plurality of spacers is distributed in a liquid crystal layer to keep the height of the gap and keep the two substrates in parallel. In addition, for a liquid crystal filling method, a liquid crystal vacuum filling method is mainly used, but this method requires a long filling time. Currently, the liquid crystal vacuum filling method is gradually replaced by a one drop fill (ODF) method, and structures of spacers need to be designed all over again. In a known technology, ball-shaped spacers are distributed between liquid crystal layers. For this structure, when a substrate is pressed, the substrate may be damaged because of rolling of the spacers, or the spacers may be unevenly distributed in a pixel region because the spacers are arbitrarily distributed. Further, a product yield is affected because of a scattering problem of spacers. In recent years, spacers are formed by using a lithography technology, in which locations, sizes, and heights of the spacers are precisely controlled, to replace a conventional structure of ball-shaped spacers.

A function of a gap structure in an LCD is to control a gap between a first substrate and a second substrate of the display. Liquid crystal materials are mainly filled between an upper sheet and a lower sheet of glass. Without the support of a gap structure, the uniformity of a gap between the two sheets cannot be desirably kept. However, the uniformity of the gap between the first substrate and the second substrate is highly significant for keeping a display effect of the LCD and keeping electrical signal quality in the LCD.

Currently, an active switch array substrate is a technology that is being developed by several panel manufacturers by using Color on Array (COA) or Color on TFT (COT). However, a photo spacer (PS) process needs to be added after processes of red, green, blue, and white photoresists. Therefore, many materials need to be used, management and control are difficult, process procedures are complex, and equipment investment is high. Both a white photoresist and a PS have transparent materials. The material of the white photoresist is more expensive than the material of the PS by at least 30 percent. Therefore, several manufacturers attempt to replace the white photoresist material with the PS. However, in practice, brightness sensitivity of the PS is not high enough, and a relatively small through hole is formed. Therefore, the size of a through hole of the white photoresist needs to be increased to more than 50 µm, so that a size exposed through the through hole is greater than 20 µm. In this way, an aperture ratio is greatly sacrificed, resulting in design difficulty or affecting a procedure yield.

SUMMARY

To resolve the foregoing technical problem, an objective of this application is to provide a photo-mask and a method for manufacturing an active switch array substrate thereof, so that a same material may be used for a white photoresist and a PS and a pixel aperture ratio may be improved.

The objective of this application is achieved and a technical problem of this application is resolved by using the following technical solution: According to this application, a photo-mask is provided. The photo-mask comprises a transparent region, a light shielding region, and a semi-transparent region disposed between the transparent region and the light shielding region, where a transmittance of the photo-mask is adjusted according to a doping amount and a distribution density of a low reflective material, so as to enable a transmittance of the semi-transparent region to be less than a transmittance of the transparent region and to be greater than a transmittance of the light shielding region.

In an embodiment of this application, the transmittance of the semi-transparent region is in a range of 30% to 70%.

In an embodiment of this application, the low reflective material is a group composed of chromium (Cr) and a compound of chromium.

In an embodiment of this application, the low reflective material is formed on the photo-mask by means of physical vapor deposition.

In an embodiment of this application, the size of the semi-transparent region is 40 µm.

In an embodiment of this application, the photo-mask is a complete-face photo-mask, without a hollowed-out design.

In an embodiment of this application, the photo-mask is an incomplete-surface photo-mask, and the photo-mask has a hollowed-out design.

Another objective of this application is to provide a method for manufacturing an active switch array substrate, comprising: providing a first substrate; disposing a first insulating layer on the first substrate; disposing a plurality of active switch units on the first insulating layer; sequentially disposing, on the first insulating layer, a plurality of photoresist layers that is arranged in parallel, so as to complete a CF layer; disposing both a plurality of PSs and a plurality of through holes on the CF layer, comprising: disposing a light shielding material layer on the CF layer to cover the CF layer; disposing a photo-mask on the light shielding material layer, where the photo-mask has a transparent region, a light shielding region, and a semi-transparent region; and performing exposure manufacturing and development manufacturing to pattern the light shielding material layer, so as to form the plurality of PSs and the plurality of through holes; and disposing a transparent electrode layer on the CF layer, where a transmittance of the photo-mask is adjusted by adjusting a doping amount and a distribution density of a low reflective material.

In an embodiment of this application, in the manufacturing method, the transmittance of the semi-transparent region is in a range of 30% to 70%.

In an embodiment of this application, in the manufacturing method, the low reflective material is a group composed of chromium and a compound of chromium.

In an embodiment of this application, in the manufacturing method, by using a design of the semi-transparent region, a through hole formed in one of the plurality of photoresist layers is greater than 20 μm.

In an embodiment of this application, in the manufacturing method, the material of the photoresist layer comprises a white photoresist.

In an embodiment of this application, in the manufacturing method, the material of the white photoresist is the same as the material of the PS.

In an embodiment of this application, in the manufacturing method, the size of the semi-transparent region is 40 μm.

Still another objective of this application is a photo-mask, comprising a transparent region; a light shielding region; and a semi-transparent region disposed between the transparent region and the light shielding region, where the size of the semi-transparent region is 40 μm, a transmittance of the photo-mask is adjusted according to a doping amount and a distribution density of a low reflective material; the low reflective material is a group composed of chromium and a compound of chromium; a transmittance of the semi-transparent region of the photo-mask is adjusted by adjusting a doping amount and a distribution density of the chromium and the compound of chromium; and the transmittance of the semi-transparent region is in a range of 30% to 70%.

In an embodiment of this application, the photo-mask is used to manufacture an active switch array substrate.

By means of this application, a same material may be used for a white photoresist and a PS and a pixel aperture ratio may be improved.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface" merely refer to directions of the accompanying drawings. Therefore, the used terms about directions are used to describe and understand this application, and are not intended to limit this application.

The accompanying drawings and the description are considered to be essentially exemplary, rather than limitative. In figures, units with similar structures are represented by using a same reference number. In addition, for understanding and ease of description, a size and a thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a substrate is described to be "on" "another component", the component may be directly on the another component, or there may be an intermediate component.

In addition, in this specification, unless otherwise explicitly described to have an opposite meaning, the word "include" is understood as including the component, but not excluding any other component. In addition, in this specification, "on" means that a component is located on or below a target component, but does not mean that the component needs to be located on top of a gravity direction.

To further describe the technical means adopted in this application to achieve the preset application objective and effects thereof, specific implementations, structures, features, and effects of a photo-mask and a method for manufacturing an active switch array substrate thereof that are provided in this application are described in detail below with reference to the accompanying drawings and preferred embodiments.

In an embodiment, an active switch (for example, TFT) array and a CF layer (CF) of this application may be formed on a same substrate.

Figure 1:
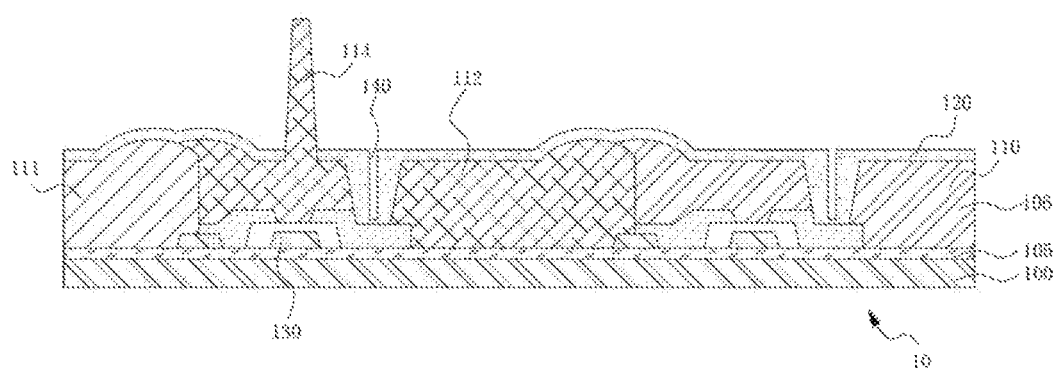
FIG. 1 is an exemplary schematic diagram of a cross section of an active switch array substrate.
Figure 2:
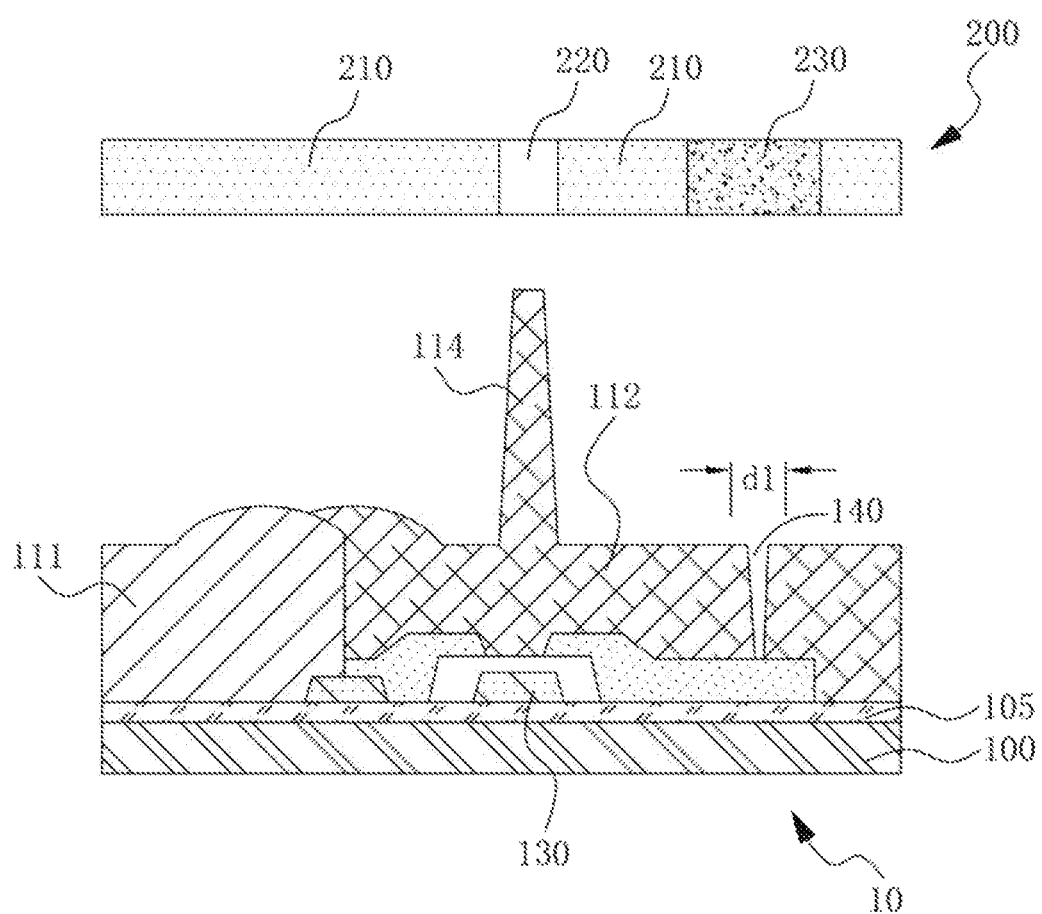
FIG. 2 is an exemplary schematic diagram of a cross section of a photo-mask disposed on an active switch array substrate.

FIG. 1 is an exemplary schematic diagram of a cross section of an active switch array substrate, and FIG. 2 is an exemplary schematic diagram of a cross section of a photo-mask disposed on an active switch array substrate. Referring to FIG. 1 and FIG. 2, an active switch array substrate 10 includes: a first substrate 100; a first insulating layer 105, disposed on the first substrate 100; a plurality of active switch array units 130, disposed on the first insulating layer 105; a CF layer 106, disposed on the first insulating layer 105, and including a plurality of first photoresist layers 110, a plurality of second photoresist layers 111, and a plurality of third photoresist layers 112 that are arranged in parallel; a plurality of PSs 114, disposed on the CF layer 106, where the material of the third photoresist layers 112 is the same as the material of the PS 114; the plurality of third photoresist layers 112 has at least one through hole 140 and the size of the through hole 140 is d1; and a pixel electrode layer 120, disposed on the CF layer 106.

In an embodiment, a photo-mask 200 includes a light shielding region 230, a transparent region 220, and a semi-transparent region 210.

In an embodiment, the third photoresist layers 112 may be white photoresist layers, and the material of the white photoresist layers is the same as the material of the PSs 114. Because the PSs 114 have relatively low photosensitivity, after related processes of exposure and development, the size d1 of the formed through hole 140 is relatively small. As a result, subsequent processes are adversely affected.

Figure 3:
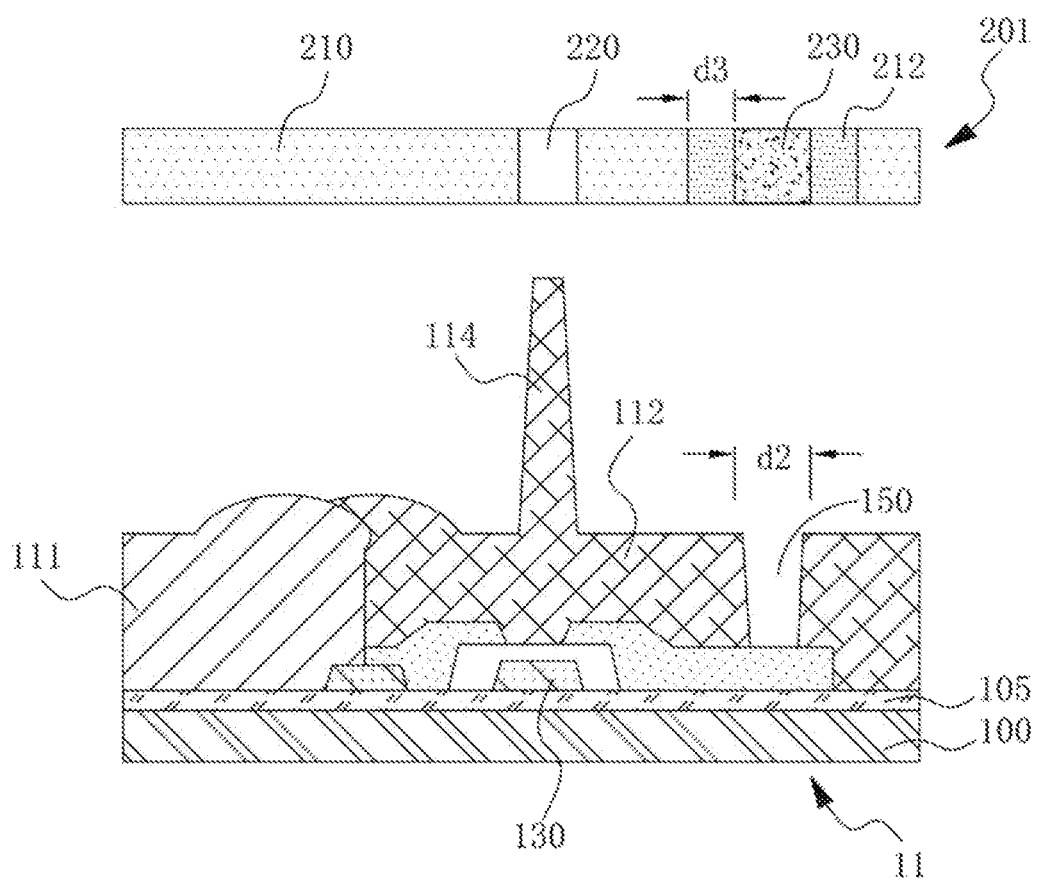
FIG. 3 is a schematic diagram of a cross section of a photo-mask disposed on an active switch array substrate according to an embodiment of this application.
Figure 4:
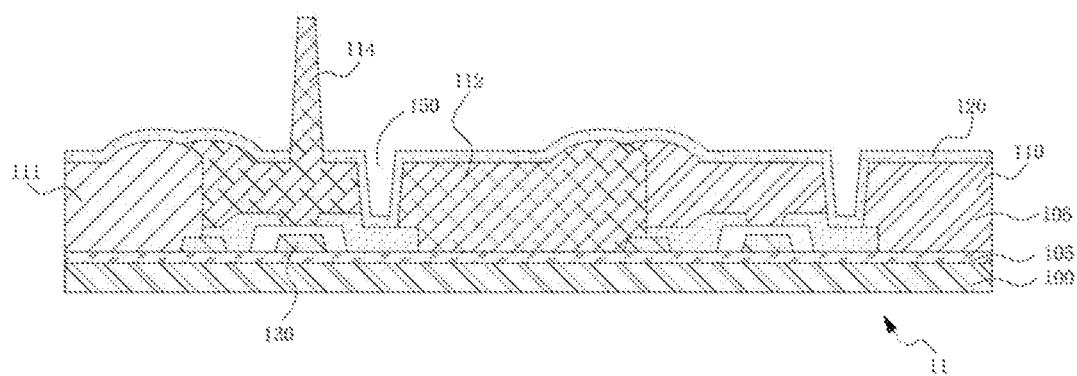
FIG. 4 is a schematic diagram of a cross section of an active switch array substrate according to an embodiment of this application.

FIG. 3 is a schematic diagram of a cross section of a photo-mask disposed on an active switch array substrate according to an embodiment of this application, and FIG. 4 is a schematic diagram of a cross section of an active switch array substrate according to an embodiment of this application. Referring to FIG. 3 and FIG. 4, a method for manufacturing an active switch array substrate 11 includes: providing a first substrate 100; disposing a first insulating layer 105 on the first substrate 100; disposing a plurality of active switch units 130 on the first insulating layer 105; sequentially disposing, on the first insulating layer 105, a plurality of first photoresist layers 110, a plurality of second photoresist layers 111, and a plurality of third photoresist layers 112 that are arranged in parallel, so as to complete a CF layer 106; disposing both a plurality of PSs 114 and a plurality of through holes 150 on the CF layer 106, including: disposing a light shielding material layer on the CF layer 106 to cover the CF layer 106; disposing a photo-mask 201 on the light shielding material layer; and performing exposure manufacturing and development manufacturing to pattern the light shielding material layer, so as to form the plurality of PSs 114 and the plurality of through holes 150; and disposing a transparent electrode layer 120 on the CF layer 106, where a transmittance of the photo-mask 201 is adjusted by adjusting a doping amount and a distribution density of a low reflective material.

In an embodiment, the photo-mask 201 has a transparent region 220 with transmittance of 98%, a light shielding region 230 with transmittance of 0%, a semi-transparent region 210 with transmittance of 1% to 98%, and another semi-transparent region 212 with transmittance of 30% to 70%.

In an embodiment, for example, the low reflective material may be a group composed of chromium and a compound of chromium. The transmittance of the semi-transparent regions 212 and 210 of the photo-mask 201 is adjusted by adjusting a doping amount and a distribution density of the chromium and the compound of chromium, so as to control the sizes of the first photoresist layers 110, the second photoresist layers 111, the third photoresist layers 112, the PSs 114, and the through holes 150 that are formed after exposure.

In an embodiment, the third photoresist layer 112 may be white photoresist layers, and the material of the white photoresist layers is the same as the material of the PSs 114. Even if the PSs 114 have relatively low photosensitivity, when the size d3 of the semi-transparent region 212 is about 40 μm, by using designs of the semi-transparent region 212 and the light shielding region 230, the size d2 of the through holes 150 formed on the white photoresist layers is greater than 20 μm, thereby facilitating subsequent processes and improving a product yield.

Figure 5:
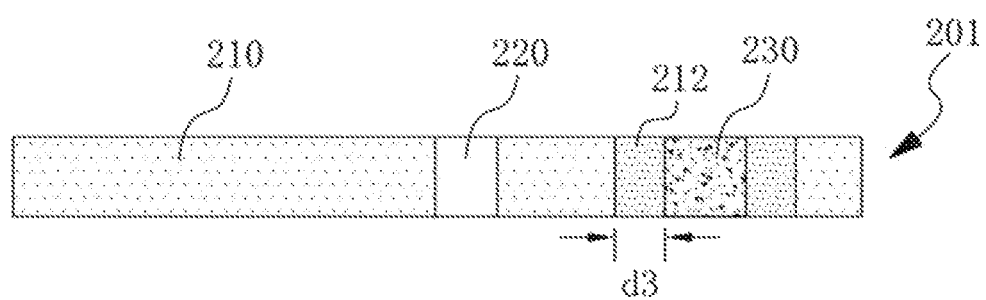
FIG. 5 is a schematic diagram of a cross section of a photo-mask used for an active switch array substrate according to an embodiment of this application.

FIG. 5 is a schematic diagram of a cross section of a photo-mask used for an active switch array substrate according to an embodiment of this application. Referring to FIG. 3, FIG. 4, and FIG. 5, a photo-mask 210 used for manufacturing an active switch array substrate 11 includes: a transparent region 220 with transmittance of 98%, a light shielding region 230 with transmittance of 0%, a semi-transparent region 210, and another semi-transparent region 212. The semi-transparent regions 212 and 210 are disposed between the transparent region 220 and the light shielding region 230. Transmittance of the photo-mask is adjusted according to a doping amount and a distribution density of a low reflective material, so as to enable the transmittance of the semi-transparent regions 212 and 210 to be less than the transmittance of the transparent region 220 and to be greater than the transmittance of the light shielding region 230.

In an embodiment, for example, the low reflective material may be a group composed of chromium and a compound of chromium. The transmittance of the semi-transparent regions 212 and 210 of the photo-mask 201 is adjusted by adjusting a doping amount and a distribution density of the chromium and the compound of chromium.

In an embodiment, a part of a semi-transparent film through which exposure light (for example, ultraviolet light and yellow light) can pass through is formed in the semi-transparent region 212, and the transmittance of the semi-transparent region 212 is in a range of 30% to 70%.

In an embodiment, the photo-mask 201 is a complete-face photo-mask, and without a hollowed-out design. A part of a semi-transparent film through which exposure light (for example, ultraviolet light and yellow light) can pass through is formed in the semi-transparent region 210, and the transmittance of the semi-transparent region 210 is in a range of 1% to 98%. A light shielding film having a property of shielding light, blocking light, or absorbing light is formed in the light shielding region 230. A transparent film through which exposure light (for example, ultraviolet light and yellow light) can pass through is formed in the transparent region 220.

In an embodiment, the photo-mask 201 is an incomplete-surface photo-mask, and the photo-mask 201 has a hollowed-out design. A part of a semi-transparent film through which exposure light (for example, ultraviolet light and yellow light) can pass through is formed in the semi-transparent region 210, and the transmittance of the semi-transparent region 210 is in a range of 1% to 98%. A light shielding film having a property of shielding light, blocking light, or absorbing light is formed in the light shielding region 230. A hollowed-out design is performed on the transparent region 220, and exposure light (for example, ultraviolet light and yellow light) can directly pass through the transparent region 220 and is irradiated on an exposure region.

In an embodiment, the low reflective material (which may be chromium and a compound of chromium) may be formed on the photo-mask 201 by means of physical vapor deposition (PVD), and the physical vapor deposition may be magnetron sputtering, ion plating, and the like.

In an embodiment, examples of the exposure light, for example, ultraviolet light and yellow light are supplements to this application and are not intended to limit this application. The exposure light may refer to another light source.

In an embodiment, the photo-mask is used to manufacture an active switch array substrate, or is used to manufacture a substrate of another type or a panel of another type, for example, a CF layer substrate, a vertical alignment display panel, or a fringe field switching display panel. This is determined according to a requirement of a designer and is not limited in this text.

A multi-grayscale mask is, for example, a gray-tone mask and a half tone mask, and is not limited thereto. The gray-tone mask is used to make a tiny slit beyond the resolution of an exposure machine, and shield a part of a light source by using the tiny slit part, so as to achieve a semi-exposure effect. In addition, the half tone mask is used to perform semi-exposure by using a "semi-transmitting" film. In both methods in the foregoing, after one time of exposure process, three exposure levels, that is, "an exposed part", "a semi-exposed part", and "an unexposed part". Therefore, photoresists with two thicknesses are formed after development (by means of such thickness differences of photoresists, patterns can be transferred to a panel or a substrate by using fewer sheets, and production efficiency of panels can be improved). In the case of the half tone mask, the cost of the photo-mask is slightly higher than that of an ordinary photo-mask.

This application has beneficial effects that a same material may be used for a white photoresist and a PS and a pixel aperture ratio may be improved.

Terms such as "in some embodiments" and "in various embodiments" are repeatedly used. Usually, the terms do not refer to a same embodiment; but they may also refer to a same embodiment. Words such as "comprise", "have", "include" are synonyms, unless other meanings are indicated in the context.

The foregoing descriptions are merely preferred embodiments of this application, and are not intended to limit this application in any form. Although this application has been disclosed above through the preferred embodiments, the embodiments are not intended to limit this application. Any person skilled in the art can make some equivalent variations or modifications according to the foregoing disclosed technical content without departing from the scope of the technical solutions of this application to obtain equivalent embodiments. Any simple amendment, equivalent change or modification made to the foregoing embodiments according to the technical essence of this application without departing from the content of the technical solutions of this application shall fall within the scope of the technical solutions of this application.

What is claimed is:

1. A photo-mask, comprising:
a transparent region;
a light shielding region; and
a semi-transparent region, disposed between the transparent region and the light shielding region, wherein
a transmittance of the photo-mask is adjusted according to a doping amount and a distribution density of a low reflective material, so as to enable a transmittance of the semi-transparent region to be less than a transmittance of the transparent region and to be greater than a transmittance of the light shielding region;
wherein the size of the semi-transparent region is 40 μm.

2. The photo-mask according to claim 1, wherein the transmittance of the semi-transparent region is in a range of 30% to 70%.

3. The photo-mask according to claim 1, wherein the low reflective material is a group composed of chromium and a compound of chromium.

4. The photo-mask according to claim 1, wherein the low reflective material is formed on the photo-mask by means of physical vapor deposition.

5. The photo-mask according to claim 1, wherein the photo-mask is a complete-face photomask without a hollowed-out design.

6. The photo-mask according to claim 1, wherein the photo-mask is an incomplete-surface photo-mask, and the photo-mask has a hollowed-out design.

7. A method for manufacturing an active switch array substrate, comprising:
providing a first substrate;
disposing a first insulating layer on the first substrate;
disposing a plurality of active switch units on the first insulating layer;
sequentially disposing, on the first insulating layer, a plurality of photoresist layers that is arranged in parallel, so as to complete a color filter (CF) layer;
disposing both a plurality of photo spacers (PSs) and a plurality of through holes on the CF layer, comprising:
disposing a light shielding material layer on the CF layer to cover the CF layer;
disposing a photo-mask on the light shielding material layer, wherein the photo-mask has a transparent region, a light shielding region, and a semi-transparent region; and
performing exposure manufacturing and development manufacturing to pattern the light shielding material layer, so as to form the plurality of PSs and the plurality of through holes; and
disposing a transparent electrode layer on the CF layer, wherein
transmittance of the photo-mask is adjusted by adjusting a doping amount and a distribution density of a low reflective material.

8. The method for manufacturing an active switch array substrate according to claim 7, wherein a transmittance of the semi-transparent region is in a range of 30% to 70%.

9. The method for manufacturing an active switch array substrate according to claim 7, wherein the low reflective material is a group composed of chromium and a compound of chromium.

10. The method for manufacturing an active switch array substrate according to claim 7, wherein by using a design of the semi-transparent region, a through hole formed in one of the plurality of photoresist layers is greater than 20 μm.

11. The method for manufacturing an active switch array substrate according to claim 7, wherein the material of the photoresist layer comprises a white photoresist.

12. The method for manufacturing an active switch array substrate according to claim 11, wherein the material of the white photoresist is the same as the material of the PS.

13. The method for manufacturing an active switch array substrate according to claim 7, wherein the size of the semi-transparent region is 40 μm.

14. A photo-mask, comprising:
a transparent region;
a light shielding region; and
a semi-transparent region, disposed between the transparent region and the light shielding region, and having a size of 40 μm, wherein
transmittance of the photo-mask is adjusted according to a doping amount and a distribution density of a low reflective material;
the low reflective material is composed of a material from a group comprising one of chromium and a compound of chromium; a transmittance of the semi-transparent region of the photo-mask is adjusted by adjusting a doping amount and a distribution density of the chromium and the compound of chromium; the transmittance of the semi-transparent region is in a range of 30% to 70%; and
the photo-mask is used to manufacture an active switch array substrate.

* * * * *